(12) United States Patent
Kurihara et al.

(10) Patent No.: US 7,477,064 B2
(45) Date of Patent: Jan. 13, 2009

(54) PROBING APPARATUS AND POSITIONAL DEVIATION ACQUIRING METHOD

(75) Inventors: Daiki Kurihara, Kamigyo-ku (JP); Hiromi Chaya, Kamigyo-ku (JP); Takanori Hyakudomi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 329 days.

(21) Appl. No.: 11/386,747

(22) Filed: Mar. 23, 2006

(65) Prior Publication Data

US 2006/0238905 A1    Oct. 26, 2006

(30) Foreign Application Priority Data

Mar. 28, 2005   (JP) .............................. 2005-090620

(51) Int. Cl.
G01R 31/02 (2006.01)
G01R 31/28 (2006.01)
(52) U.S. Cl. .................... 324/758; 324/158.1; 324/537; 324/754
(58) Field of Classification Search .............. 324/158.1, 324/537, 754, 758
See application file for complete search history.

(56) References Cited

U.S. PATENT DOCUMENTS 5,644,245 A * 7/1997 Saitoh et al. ................ 324/754
6,111,421 A * 8/2000 Takahashi et al. ........... 324/758
6,356,093 B2 * 3/2002 Nishikawa et al. .......... 324/758
2004/0081349 A1   4/2004 Chaya et al.
2004/0227504 A1 * 11/2004 Strom ..................... 324/158.1

FOREIGN PATENT DOCUMENTS

JP           7-29946        1/1995

* cited by examiner

Primary Examiner—Ha Tran T Nguyen
Assistant Examiner—Karen M Kusumakar
(74) Attorney, Agent, or Firm—Oblon, Spivak, McClelland, Maier & Neustadt, P.C.

(57) ABSTRACT

In a prober, a post-contact image representing a region including a pad is acquired by capturing an image of a substrate after a probe has been brought into contact with the pad having an existing probe mark. An image storage unit stores in advance a pre-contact image representing the pad-inclusive region before the probe is brought into contact with the pad. A latest probe mark position acquiring unit acquires a position of a latest probe mark region created by the contact of the probe with the pad from among a plurality of probe mark regions in the post-contact image respectively corresponding to a plurality of probe marks on the pad by comparing the post-contact image with the pre-contact image. A positional deviation acquiring unit finds a deviation in a contact position of the probe with respect to the pad, based on the position of the latest probe mark region.

7 Claims, 11 Drawing Sheets

PROBING APPARATUS AND POSITIONAL DEVIATION ACQUIRING METHOD

FIELD OF THE INVENTION

The present invention relates to a probing apparatus for conducting an electrical inspection for a test object formed on a substrate and a method for use in a probing apparatus for finding a contact position deviation of a probe that makes contact with an electrode formed on a substrate.

BACKGROUND OF THE INVENTION

Conventionally, there has been implemented a task of bringing a probe into contact with a pad contained in a wiring pattern formed on a semiconductor substrate to inspect electrical characteristics of the wiring pattern, which task is referred to as "probing by a prober". In such a probing process, a task is conducted for correcting a contact position of the probe on the pad, which task is called "PTPA (Probe-To-Pad Alignment)" or "APTPA (Automatic Probe-To-Pad Alignment)".

For example, Japanese Patent Laid-open Publication No. H6-318622 (Reference 1) discloses a technique of bringing a probe into contact with a pad on a so-called dummy substrate, then picking up an image of a region inclusive of the pad to detect a contact mark of the probe (i.e., a probe mark) on the pad, and correcting a contact position of the probe with respect to the substrate pad, namely, a test object, based on the result of detection of the probe mark.

Further, Japanese Patent Laid-open Publication No. 2004-79733 (Reference 2) proposes a technique of adjusting a contact position of a probe with respect to a pad, by virtue of picking up an image of a region inclusive of the pad while irradiating a spot light on a substrate pad to form a focal point at the same height as a leading end of the probe in a probing process, and then detecting an on-pad position of the irradiated light.

In the meantime, a probe mark inspection (referred to as "PMI") is also carried out by capturing a multiple tone image of a region inclusive of a pad in the probed substrate. In this way, it is confirmed whether the probing has been properly conducted or not.

Further, Japanese Patent Laid-open Publication No. H7-29946 (Reference 3) discloses a technique of adjusting an overdrive amount at a time when a probe is brought into contact with a next inspected pad, by capturing an image of a pad-inclusive region from a probed substrate and measuring the length of a probe mark on the pad.

By the way, in case of employing the techniques taught in References 1 and 2 to conduct the correction of a probe contact position with respect to a pad, it is inevitable either to detect a probe mark on a pad of a dummy substrate or to detect an irradiated position of a spot light on a pad, which leads to a prolonged probing time.

Moreover, in the event that a probing is conducted several times for a single pad, probe marks are left on the pad in plural numbers. This means that no deviation in a probe contact position can be detected merely by capturing an image that contains the pad. Particularly, if the latest probe mark overlaps with other probe marks (whether intentional or not), it becomes extremely difficult to detect a deviation.

SUMMARY OF THE INVENTION

It is, therefore, an object of the present invention to properly acquire a deviation in a probe-to-pad contact position even when a plural number of probe marks exist on a pad.

In accordance with an aspect of the invention, there is provide a probing apparatus for conducting an electrical inspection for a test object formed on a substrate, including: a probe for making contact with an electrode formed on the substrate; an image pickup unit for acquiring a first image representing a region inclusive of the electrode, by capturing an image of the substrate after the probe has been brought into contact with the electrode having at least one probe mark; an image storage unit for storing a second image representing the electrode-inclusive region before the probe is brought into contact with the electrode; a latest probe mark position acquiring unit for, by comparing the first image with the second image, acquiring a position of a latest probe mark region created by the contact of the probe with the electrode from among a plurality of probe mark regions in the first image respectively corresponding to a plurality of probe marks left on the electrode; and a positional deviation acquiring unit for finding a deviation in a contact position of the probe with respect to the electrode, based on the position of the latest probe mark region.

In the probing apparatus, preferably, the contact position deviation found in the positional deviation acquiring unit is used as a correction amount when the probe or a probe of other probing apparatus is brought into contact with the electrode of the substrate next time.

Further, the latest probe mark position acquiring unit may include: an incremental region acquiring part for, by comparing the first image with the second image, acquiring an incremental region increased by the contact of the probe with the electrode from among a probe mark existing region occupied by the plurality of probe mark regions; and an incremental region complementing part for, if the incremental region has an area smaller than a predetermined value, acquiring the latest probe mark region by combining the incremental region with a complementing region in the probe mark existing region from which the incremental region is excluded. In this way, it is possible to easily acquire a position of a latest probe mark region even if the latest probe mark region overlaps with other probe mark regions.

Preferably, the incremental region complementing part is adapted to, within an all probe mark containing region defined by a rectangle circumscribing the plurality of probe mark regions in the first image, set a symmetrical rectangle that makes a point symmetry about a center point of the all probe mark containing region with respect to a rectangle circumscribing at least one probe mark region in the second image corresponding to the at least one probe mark, and the complementing region is disposed within the symmetrical rectangle.

Preferably, the size of the complementing region is determined based on the difference between a predetermined value indicative of a single probe mark area and an area of the incremental region. In this way, the position of the latest probe mark region can be acquired with an increased degree of precision.

Preferably, the second image is a binary image and the incremental region is acquired by conducting a binarization after the first image is masked by the second image in the incremental region acquiring part. In this way, it is possible to reduce the memory capacity of an image storage unit.

Preferably, the second image is an image acquired by the image pickup unit immediately before the probe makes contact with the electrode.

In accordance with another aspect of the invention, there is provided a positional deviation acquiring method for finding a contact position deviation of a probe that makes contact with an electrode formed on a substrate, in a probing apparatus for conducting an electrical inspection for a test object formed on the substrate, including the steps of: acquiring a first image representing a region inclusive of the electrode by capturing an image of the substrate after the probe has been brought into contact with the electrode having at least one probe mark; acquiring a position of a latest probe mark region created by the contact of the probe with the electrode from among a plurality of probe mark regions in the first image respectively corresponding to a plurality of probe marks left on the electrode, by comparing the first image with a second image representing the electrode-inclusive region before the probe is brought into contact with the electrode; and finding a deviation in a contact position of the probe with respect to the electrode, based on the position of the latest probe mark region.

According to the present invention, by acquiring a position of a latest probe mark from among a plurality of probe marks on an electrode, it becomes possible to properly acquire a deviation in a contact position of a probe with respect to the electrode.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Preferred embodiments of the present invention will be described in detail hereinbelow with reference to the accompanying drawings.

Figure 1:
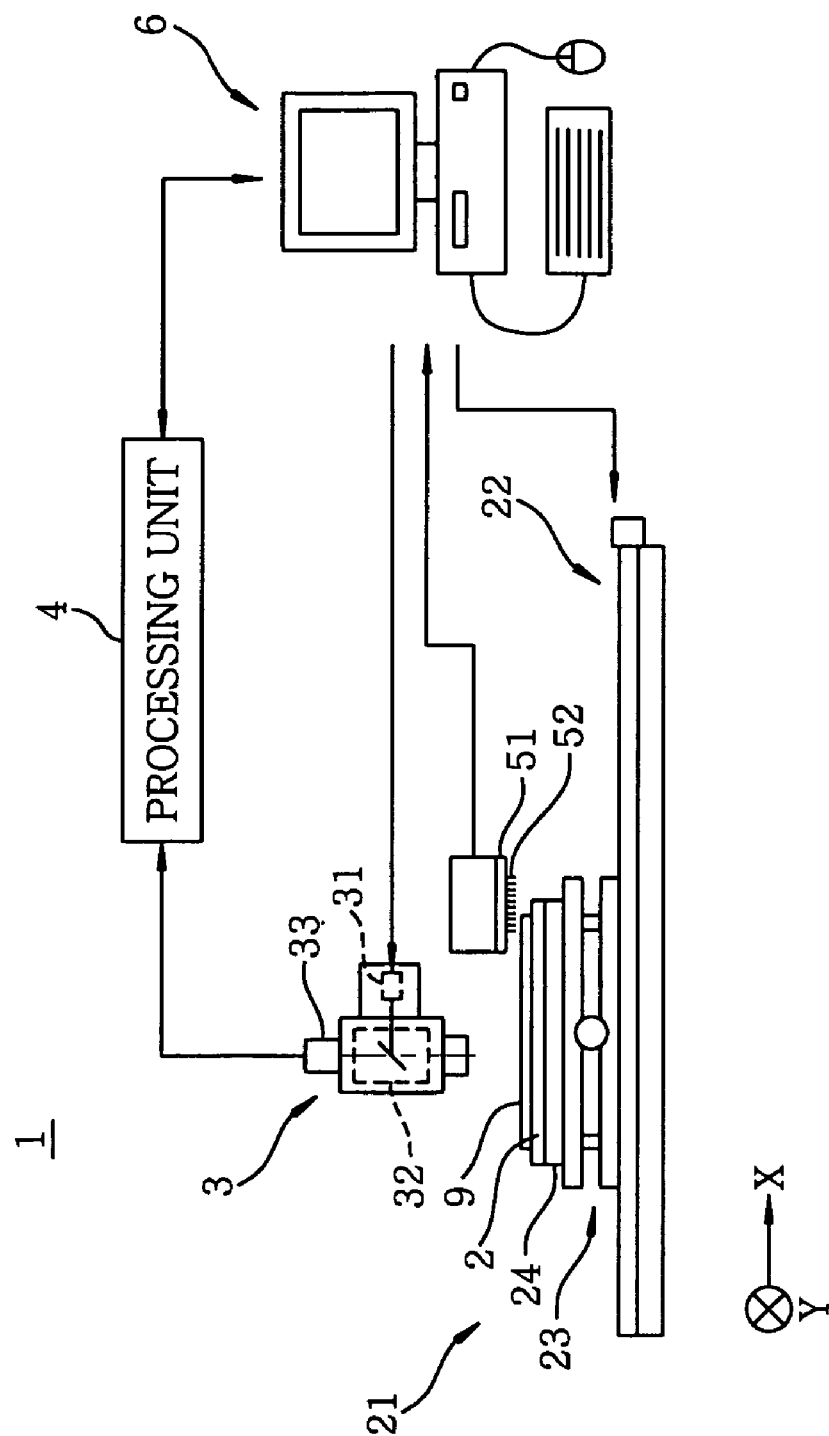
FIG. 1 is a view showing the configuration of a prober.

FIG. 1 is a view showing the configuration of a prober 1 in accordance with a preferred embodiment of the present invention. The prober 1 is adapted to bring a probe into contact with a pad (e.g., a pad formed by aluminum deposition) contained in a wiring pattern formed on a semiconductor substrate 9 to thereby conduct an electrical inspection (probing) for the wiring pattern. After completion of the probing, the prober 1 performs a PMI (probe mark inspection) and, during such an inspection, acquires a correction amount (a set of values needed for correction) in a contact position of the probe with respect to the pad, which correction amount is applied to a next electrical inspection for the same substrate 9 that has been subject to a subsequent process.

The prober 1 includes a stage 2 for supporting the substrate 9 whose pad has a probe mark formed by other probers (or the same prober 1, which holds true hereinbelow), an image pickup unit 3 for taking an image of the substrate 9 to acquire a multiple tone image thereof, a stage driving part 21 for moving the stage 2 relative to the image pickup unit 3, a processing unit 4, i.e., an electric circuit, for receiving image data from the image pickup unit 3, a probe card 51 on which are two-dimensionally arranged a plurality of probes 52 respectively making contact with a plurality of pads on the substrate 9, and a computer 6 including a CPU for conducting a variety of operational processing, a memory for storing various information and the like. Other components of the prober 1 are controlled by the computer 6. It should be noted in FIG. 1 that only one of the probes 52 is designated by reference numeral 52, and they are actually much smaller in size than other components.

The image pickup unit 3 includes an illumination unit 31 (e.g., a halogen lamp) for irradiating an illumination light, an optical system 32 for guiding the illumination light to the substrate 9 and receiving a light from the substrate 9, and an image pickup device 33 (e.g., an array of CCD elements) for converting the image of the substrate 9 obtained by the optical system 32 to electrical signals. Image data of the substrate 9 are outputted from the image pickup device 33. The stage driving part 21 has an X-direction movement mechanism 22 for moving the stage 2 in an X-direction in FIG. 1, a Y-direction movement mechanism 23 for moving the stage 2 in a Y-direction, and a rotating mechanism 24 for rotating the stage 2 about an axis of rotation perpendicular to the X-Y plane in FIG. 1.

Figure 2:
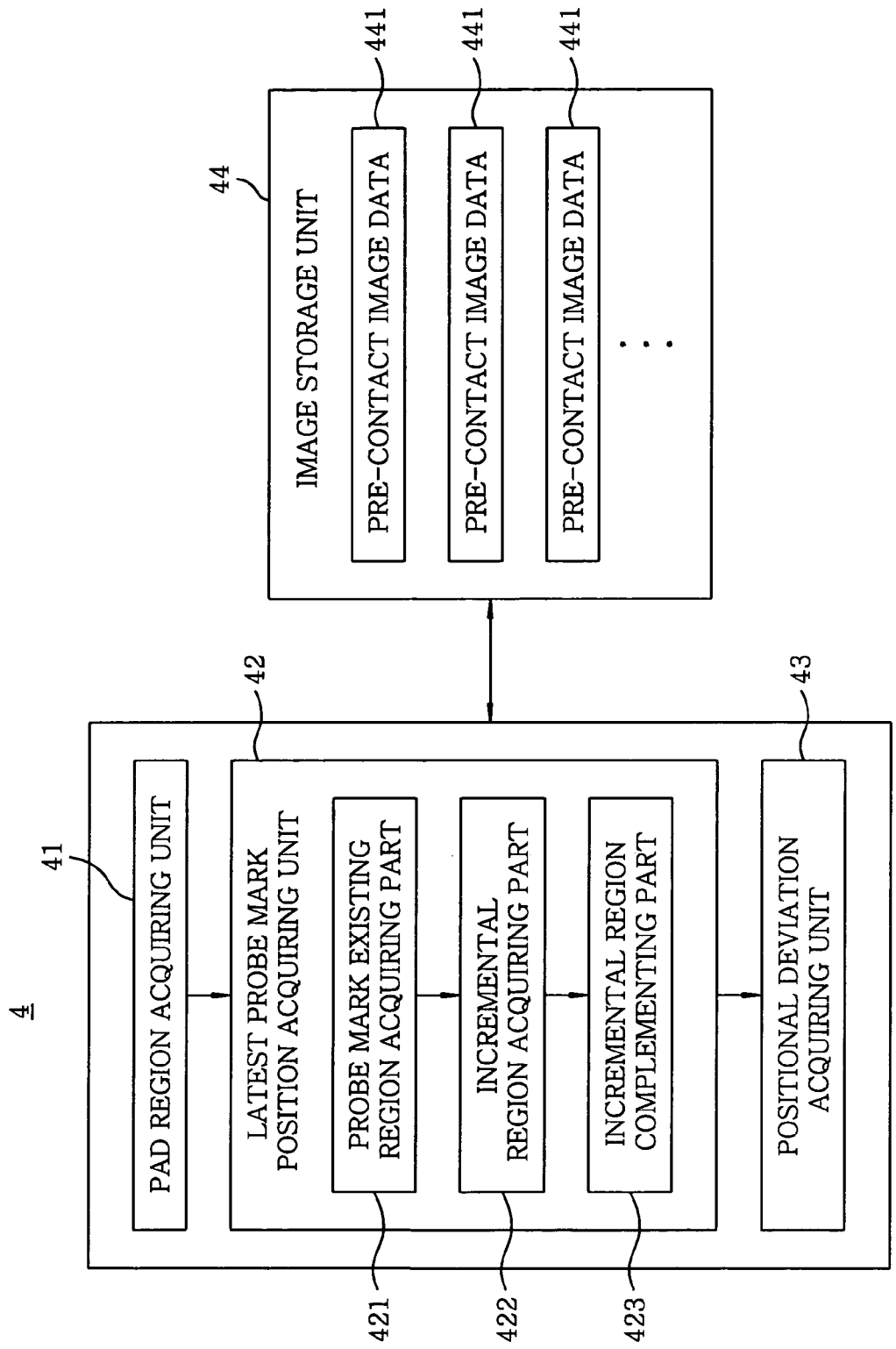
FIG. 2 is a view depicting the configuration of a processing unit.

FIG. 2 is a view depicting the configuration of the processing unit 4. The processing unit 4 includes a pad region acquiring unit 41 for acquiring a pad region representing the pad from the image inputted from the image pickup unit 3, a latest probe mark position acquiring unit 42 for acquiring a position of a probe mark region representing the latest probe mark from the image taken after the probes 52 has been brought into contact with the pads, a positional deviation acquiring unit 43 for finding a deviation (a vector indicating the distance and the direction of deviation) in a contact position of the individual probes 52 with respect to each of the pads, based on the position of the latest probe mark region, and an image storage unit 44 for storing multiple tone pre-contact image data 441 representing a region inclusive of the individual pads not yet contacted by the probes 52 (herein, assuming for each of the pads to have a probe mark formed by other probers).

Figure 3A:
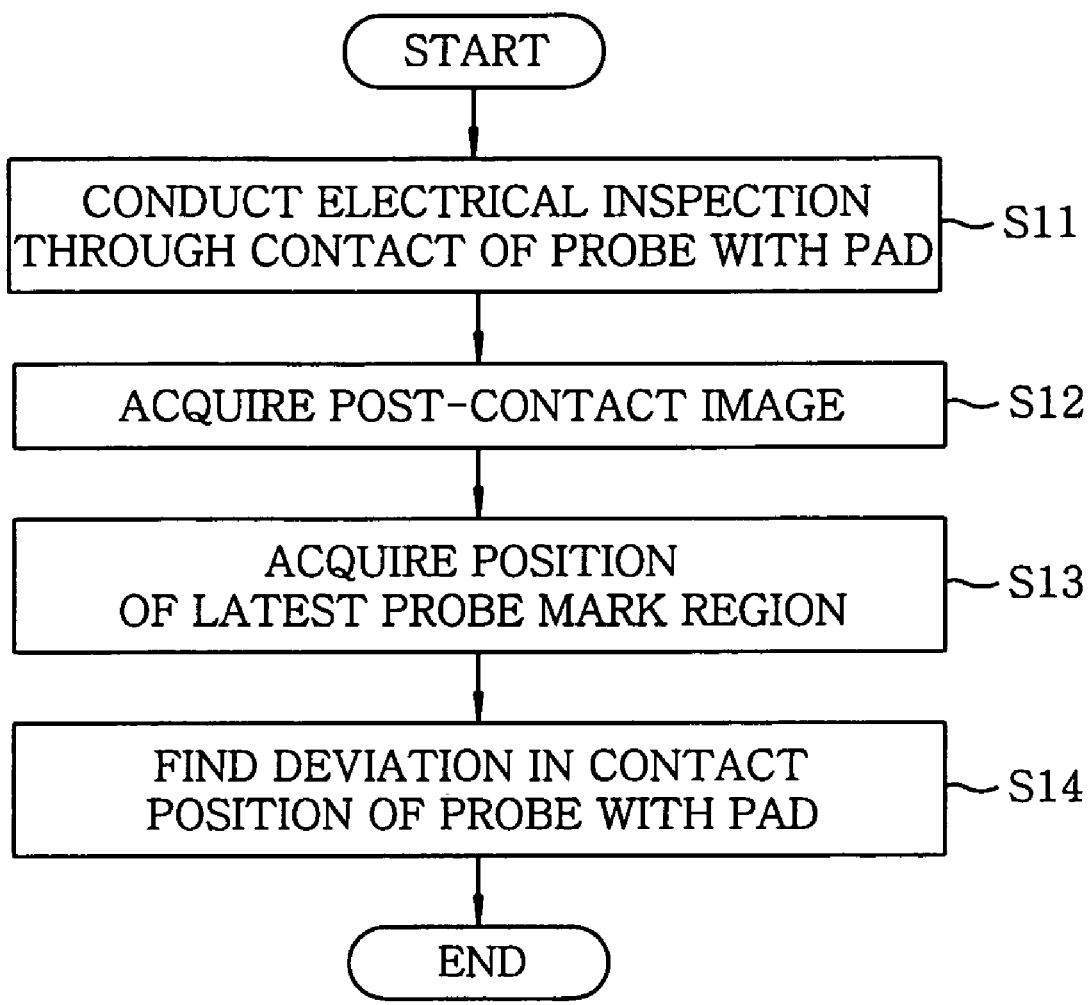
FIG. 3A is a flow chart illustrating the flow of a probing process in a prober.

FIG. 3A is a view illustrating the flow of a probing process in the prober 1. In the description given below, the probe mark already formed on each of the pads will be referred to as an existing probe mark, as opposed to the latest probe mark freshly formed on each of the pads by the probes 52. There may also be a case where each of the pads has the existing probe mark in plural numbers.

In the prober 1, the substrate 9, i.e., a test object, whose pads (or a part of pads) have an existing probe mark formed during a probing process in other probers, is first mounted on the stage 2 in a predetermined orientation (rotational angle) such that the center of the substrate 9 coincides with the axis of rotation of the rotating mechanism 24. The computer 6 controls the stage driving part 21, based on the layout data of the wiring pattern and the positions of the plurality of probes 52 on the probe card 51, thus moving the substrate 9 to a predetermined position. This allows the plurality of probes 52 to be respectively in a confronting relationship with the corresponding pads on the substrate 9. Then, the plurality of probes 52 are brought into contact with the plurality of confronting pads at a prescribed overdrive amount by means of an extension and retraction mechanism (not shown), after which an electrical inspection is performed for the wiring pattern of the substrate 9 (Step S11). At this time, the surfaces of the respective pads are slightly cut out by the leading ends of the probes 52 abutting against the pads, which assures conduction between the probes 52 and the pads. If the electrical inspection is completed, the probes 52 are moved out of contact with the pads, leaving a probe contact mark (namely, the latest probe mark) on each of the pads.

Subsequently, under the action of the stage driving part 21, the image pickup position of the image pickup unit 3 above the substrate 9 is subject to relative movement toward the vicinity of the pads just tested. Then, the image pickup unit 3 acquires a multiple tone image representing a region inclusive of the pads on the substrate 9 (Step S12). The multiple tone image will be called a "post-contact image" hereinbelow. In this embodiment, the pixel value contained in a pad region of the post-contact image is greater than the pixel value in other region than the pad region. In other words, the pad region is brighter than the out-of-pad region.

In the prober 1, for example, the probes 52 are two-dimensionally arranged within a predetermined rectangular region of the probe card 51. In such an arrangement of the probes 52, the pads respectively contacted by the substantially centered probe 52 and by the probes 52 positioned at four corners of the rectangular region become the pads targeted for acquisition of the latest probe mark position (hereinbelow referred to as "object pads"). These object pads are image-taken one after another to acquire a plurality of post-contact images. It goes without saying that the entire pads contacted by the probes 52 may be the object pads. The object pads provide a basis for finding a deviation in a contact position of each of the probes 52 as will be described later.

Each of the post-contact images is fed to the processing unit 4 in association with an identification number identifying a die (a region which will become a chip) on the substrate 9 and an identification number identifying a pad in the die (hereinbelow simply referred to as an "ID number"). Further, the post-contact images are supplied to the computer 6 and stored in a memory unit of the computer 6 for reference so that they can be used in the probe mark inspection in relation to the probe-to-pad contact.

Once the post-contact images are acquired, the latest probe mark acquiring part 42 acquires a position of a latest probe mark region (and the center position of a pad region) created by the contact of the probes 52 with the pads from among a plurality of probe mark regions in the post-contact images respectively corresponding to a plurality of probe marks (i.e., an existing probe mark and a latest probe mark) left on the pads (Step S13). The process of acquiring the position of the latest probe mark region will be described in detail later.

Then, the positional deviation acquiring unit 43 finds a correction amount in a contact position of the probes 52 with respect to the pads, based on the positions of the plurality of latest probe mark regions acquired in each of the plurality of object pads.

Hereinafter, descriptions will now be given regarding a method of finding the correction amount in the contact position of the probes 52 with respect to the pads on the substrate 9, from among the plurality of latest probe mark regions. In this embodiment, under the assumption that the substrate 9 is deviated a certain distance from the test position respectively in an X-direction and a Y-direction on a two-dimensional coordinate system defined by two axes, i.e., an X-axis and a Y-axis, there is calculated the sum of squares of the distances between the center points of the respective object pads and the positions of the actual latest probe marks (hereinbelow referred to as an "error"). Then, the combination of an X-direction distance and a Y-direction distance, which minimizes the error, is found as a contact position correcting distance (a part of the values included in the correction amount). More specifically, given that (ui, vi) represents the coordinates of the center point of the pad region for each of the object pads i in the arrangement of the substrate 9 upon inspection, (xi, yi) denotes the position of the latest probe mark region found for each of the object pads i in the arrangement of the substrate 9 upon inspection, and x and y are the displacements in the X-direction and the Y-direction at the time of deviating the position of the substrate 9, the error Lt can be calculated by Equation 1 where the number of the object pads is N and the displacements x and y are variables.

$$Lt = \Sigma((xi-(x+ui))^2 + (yi-(y+vi))^2 \qquad \text{Eq. 1}$$

Then, Eq. 1 is partially differentiated with respect to each of x and y to find correction distances dx and dy which are the values of x and y minimizing the error Lt. In this way, the combination of correction distances dx and dy minimizing the error Lt can be calculated by Equation 2.

$$dx = (\Sigma(xi-ui))/N$$

$$dy = (\Sigma(yi-vi))/N \qquad \text{Eq. 2}$$

If attention is drawn to the X-direction and the Y-direction, by using Eq. 2, the correction distances dx and dy of the position of the substrate 9 are found as the average values of the distances (i.e., deviations (vectors) in the contact positions) between the position of the latest probe mark region and the center point of the pad region in the arrangement of the substrate 9 upon inspection. In other words, the deviations in the contact positions of the probes 52 with respect to the center of the pads are calculated based on the position of the latest probe mark region in each of the object pads, and the averages of these deviations become the correction distances of the substrate 9 in the X-direction and the Y-direction (Step S14).

Further, in an effort to bring the probes 52 into contact with the pads closer to the center of pads, a correction angle for the rotational angle of the substrate 9 may be found as a part of the correction amount. For example, the substrate 9 is assumed to be rotated by the rotating mechanism 24 by an angle θ from the orientation (rotational angle) upon inspection after the position of the substrate 9 has been corrected from the test process position by the correction distances dx and dy. Under this assumption, an equation is found that represents an error, i.e., the sum of squares of the distances between the center points of the respective object pads and the positions of the actual latest probe marks. Taking into account that the angle θ is trivial, both sides of the numerical formula are differentiated by θ, thus finding the value of θ minimizing the error, namely, a correction angle dθ, as represented by Equation 3.

$$d=[\Sigma((yi+dy)(xi-ui-dx)+(xi-dx)(yi-vi-dy))]/[\Sigma((yi-dy)^2+(xi-dx)^2)]$$ Eq. 3

The correction distances dx and dy of the position and the correction angle dθ of the rotational angle thus obtained are fed to the computer 6 and stored at its memory part as a correction amount. Further, the substrate 9 is taken out from the stage 2 and subject to other kinds of electrical inspections in a prober having the same stage driving part as that of the prober 1. At this time, by the X-direction movement mechanism and the Y-direction movement mechanism, the substrate 9 is positioned deviated from the previous test position by the correction distances dx and dy. This enables the probes to make contact with the corresponding pads in the vicinity of the center of the individual pad. Further, the rotating mechanism changes the orientation of the substrate 9 by the correction angle dθ, thereby more accurately correcting the contact position of the probes with the pads. Thereafter, the probes are actually brought into contact with the pads so that a next electrical inspection can be performed in a suitable manner. Needless to say, the next electrical inspection may be conducted by the prober 1 and in this case the contact position of the probes 52 with the pads is corrected. Namely, the deviations in the contact positions of the probes 52 with respect to the pads found in the positional deviation acquiring unit 43 are used as a correction amount when the probes 52 or probes of other probers will be brought into contact with the corresponding electrodes on the substrate 9 in the next time. In a case where a mechanism for moving the plurality of probes in the X-direction and the Y-direction is provided to move the plurality of probes relative to the substrate 9 kept stationary, the correction distances from predetermined initial positions of the plurality of probes become (−dx) and (−dy) in the X-direction and the Y-direction, respectively.

There will now be described a process of acquiring the position of the latest probe mark region.

Figure 3B:
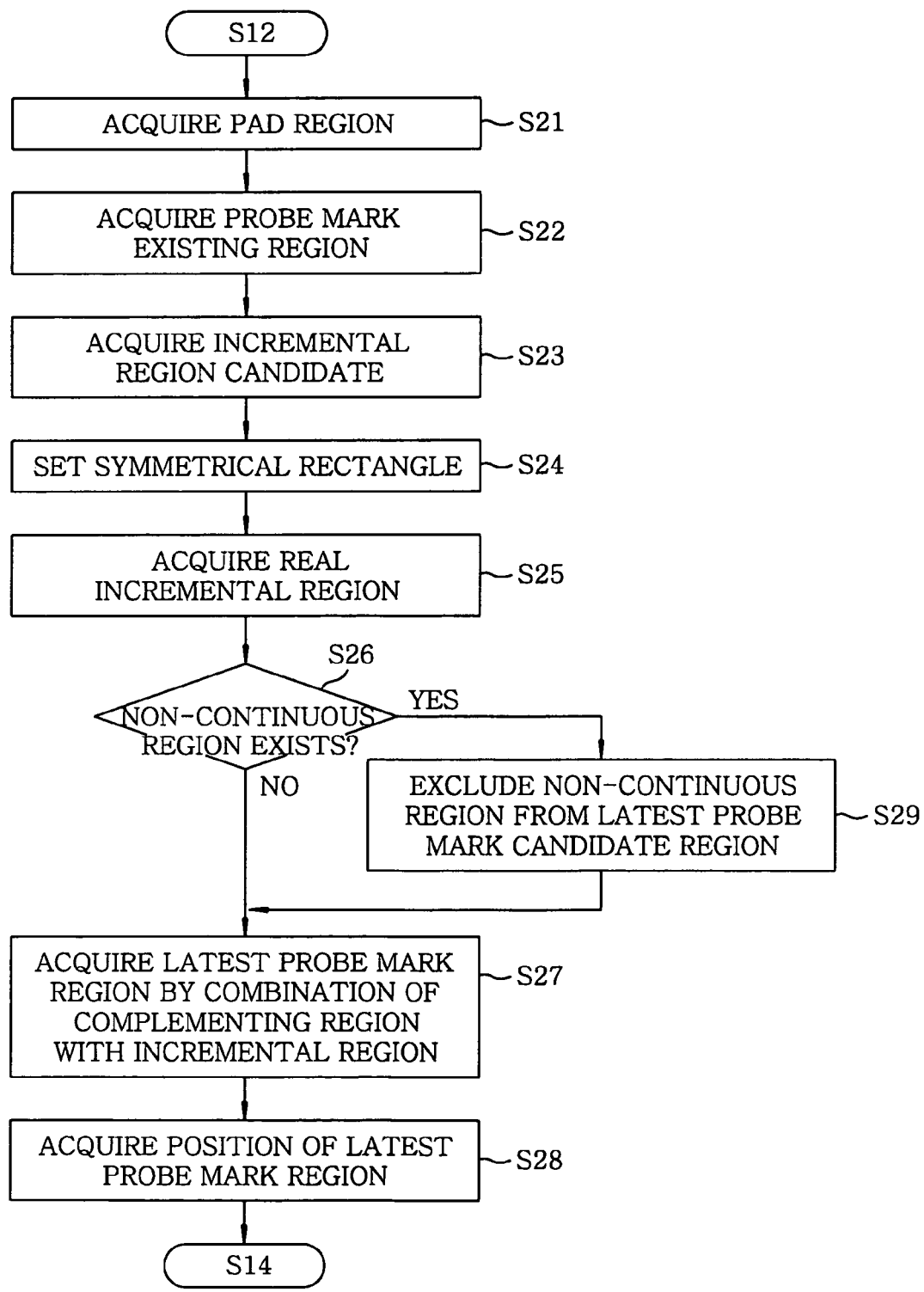
FIG. 3B is a flow chart showing the flow of a process for acquiring a position of a latest probe mark region.

FIG. 3B is a flow chart illustrating the flow of a process for acquiring the position of the latest probe mark region, which is performed at the step S13 in FIG. 3A. Although the following description is focused on a single post-contact image (a plural number of pads may be included in the single post-contact image), it should be noted that the same processing is sequentially conducted for the remaining post-contact images.

If a post-contact image is acquired in the image pickup unit 3 (Step S12 in FIG. 3A), the value of respective pixels of the post-contact image is compared with a predetermined threshold value in the pad region acquiring unit 41 to binarize the post-contact image. In the binarization process, for example, a pixel equal to or greater than the threshold value is given a value "1" representing a white pixel, while a pixel smaller than the threshold value is given a value "0" meaning a black pixel. In the binarized post-contact image, a set of 1-value pixels interconnected by a labeling treatment is specified, and a 0-value pixel enclosed by the set of 1-value pixels is converted to a 1-value pixel. Then, the set of 1-value pixels in the converted post-contact image is acquired as a pad region (Step S21). Also acquired at this time is a center position of the pad region.

Figure 4:
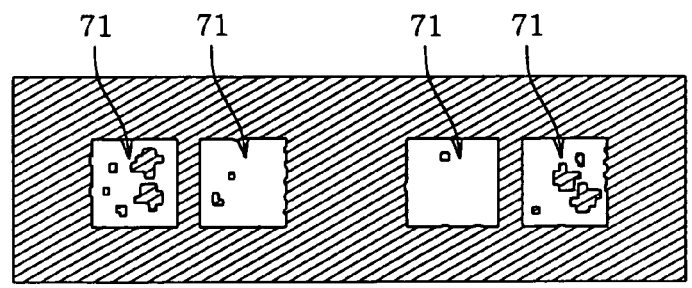
FIG. 4 is a view showing pad regions.

FIG. 4 is a view showing pad regions 71 acquired from the post-contact image. In FIG. 4, there are illustrated four pad regions 71, with the black pixels indicated by a parallel line hatching. Further, in FIG. 4, black regions are also shown within the pad regions 71 acquired by binarizing the post-contact image with the pad threshold value. As described above, these black regions are actually treated as the pad regions 71. Although the following description will be focused on a pad region corresponding to a single object pad, it should be appreciated that the same processing is conducted for pad regions corresponding to other object pads if a plurality of object pads are included in a single post-contact image.

Figure 5A:
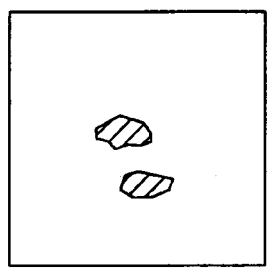
FIG. 5A is a view illustrating a binary image.

Once the pad regions 71 are acquired, in a probe mark existing region acquiring part 421 (see FIG. 2) of the latest probe mark position acquiring unit 42, the portion of the pad regions 71 is extracted from the multiple tone post-contact image as a post-contact pad image. Then, the value of each of the pixels included in the post-contact pad image is compared with a predetermined threshold value. A pixel equal to or greater than the threshold value is given a value "1" representing a white pixel, while a pixel smaller than the threshold value is given a value "0" meaning a black pixel. This binarizes the post-contact pad image, thus creating a binary image as illustrated in FIG. 5A. Further, the black pixels are indicated by a parallel line hatching in FIG. 5A (also in FIGS. 5B, 6A and 6B described below).

Figure 5B:
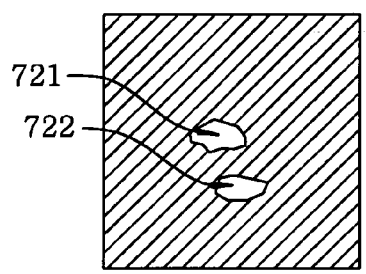
FIG. 5B is a view illustrating an image of a probe mark existing region.

Subsequently, the value 1 and the value 2 are interchanged in the image shown in FIG. 5A, thereby creating a binary image as illustrated in FIG. 5B. A set of 1-value pixels (white pixels in FIG. 5B) interconnected by a labeling treatment is specified as clusters 721 and 722, and these clusters 721 and 722 are then acquired as a probe mark existing region occupied by a plurality of probe mark regions of the post-contact image (Step S22). At this time, unnecessary noise components in FIG. 5B are removed by performing a contracting treatment and then an expanding treatment with respect to the respective clusters. Further, in the following description, the image representing the probe mark existing region will be referred to as a probe mark existing region image.

If the probe mark existing region is acquired, the pad region acquiring unit 41 reads out one pre-contact image data 441 from a plurality of pre-contact image data 441 stored at the image storage unit 44, based on the ID numbers of attention-paid object pads. As set forth above, the pre-contact image refers to an image representing a region inclusive of a pad not yet contacted by the probes 52 (but having existing probe marks formed by other probers). The pre-contact image is acquired by, e.g., conducting a probe mark inspection with another device after the existing probe marks have been formed by means of other probers. The pre-contact image thus acquired is stored at another computer. Then, the pre-contact image is inputted to the computer 6 via a prescribed communication network or a storage medium and stored at the image storage unit 44 by the computer 6. In the pad region acquiring unit 41, as with the post-contact pad image, a pad region is acquired from the pre-contact image, and the portion of the pad regions corresponding to the attention-paid object pads in the pre-contact image is extracted as a pre-contact pad image. Moreover, the pre-contact pad image may be stored in advance at the image storage unit 44, in which case no processing is performed for extracting the portion of the pad regions from the pre-contact image.

Figure 6A:
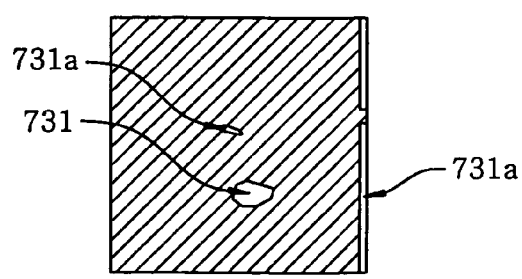
FIG. 6A is a view illustrating a binary image.
Figure 6B:
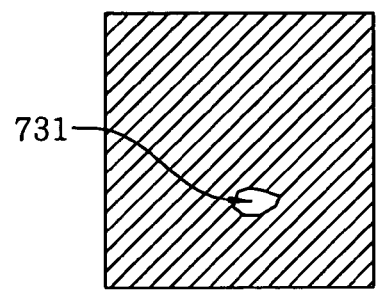
FIG. 6B is a view illustrating an image of an incremental region candidate.

Subsequently, an incremental region acquiring part 422 finds the difference between the value of each pixel in the post-contact image and the value of the corresponding pixel in the pre-contact pad image, and generates a differential image wherein the absolute value of the difference is regarded as the value of each pixel. The differential image is binarized with a predetermined threshold value, thus creating a binary image as shown in FIG. 6A. In the binary image illustrated in FIG. 6A, a fine-sized cluster 731a is present at the vicinity of an edge of the probe mark region or the pad region, in addition to a relatively large cluster 731. By performing a contracting treatment and then an expanding treatment with respect to the respective clusters, the incremental region acquiring part 422 acquires a binary image representing only the cluster 731 as depicted in FIG. 6B, and the cluster 731 is regarded as a candidate for the incremental region increased from the probe mark existing region by the contact of the probes 52 with the object pads (Step S23). In the following description, the image representing the candidate for the incremental region will be referred to as an incremental region candidate image.

In this connection, although a plurality of probe marks are formed at spaced-apart positions in the object pads from which the image of the probe mark existing region has been acquired as in FIG. 5B, the plurality of probe marks may be partially overlapped with each other depending on the object pads. In the following description, the term "probe mark region" refers to each region of the probe marks created by the contact of the probes regardless of whether the probe marks overlap or not, and the term "probe mark existing region" refers to a region occupied by all the probe marks, with an overlap disregarded.

Figure 7A:
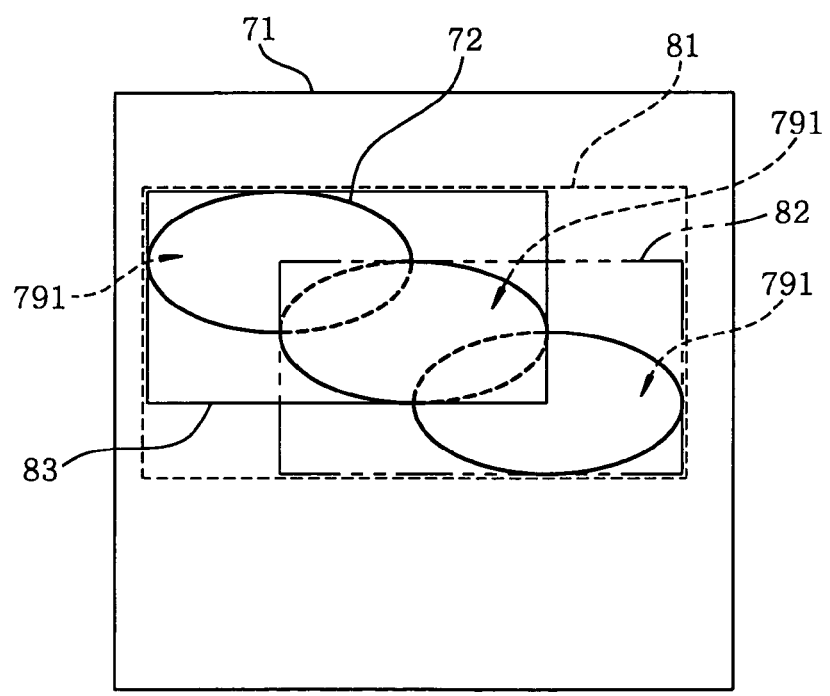
FIG. 7A is a view illustrating an image of a probe mark existing region.
Figure 7B:
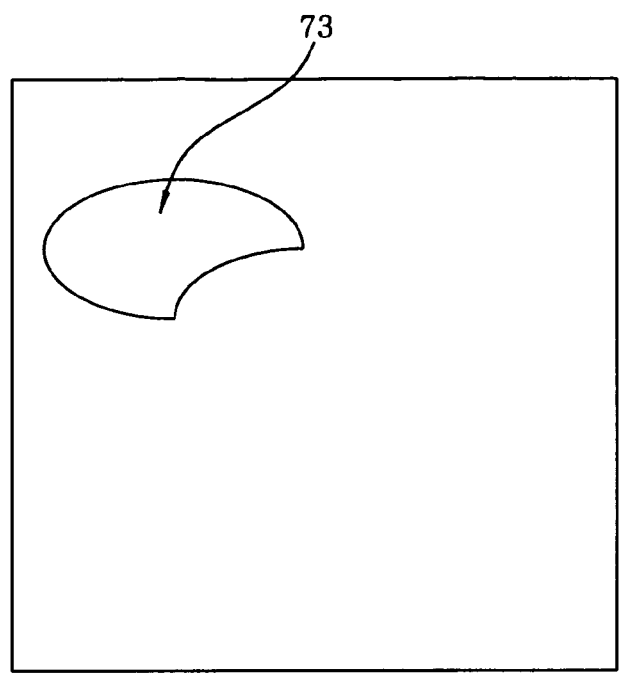
FIG. 7B is a view illustrating an image of an incremental region candidate.

FIG. 7A is a view illustrating an image of the probe mark existing region derived from the post-contact pad image representing separate object pads, and FIG. 7B is a view illustrating an image of the incremental region candidate in the object pads. Reference numeral 72 in FIG. 7A designates a probe mark existing region (the region enclosed by a solid line), and the reference numeral 73 in FIG. 7B designates a candidate of the incremental region. In FIG. 7A, the probe mark existing region 72 is set as a set of white pixels whose value is equal to 1 while the remaining region is set as a black pixel whose value is equal to 0. In FIG. 7B, the candidate 73 of the incremental region is set as a set of white pixels whose value is equal to 1 but the remaining region is set as a black pixel whose value is equal to 0.

In practice, in the probe mark existing region image illustrated in FIG. 7A, three probe mark regions 791 of an elliptical shape are arranged, and the center probe mark region 791 is partially overlapped with the other probe mark regions 791 disposed at both sides thereof. Therefore, the probe mark existing region 72 in FIG. 7A is defined by a region enclosed by a succession of peripheral edges of the three probe mark regions 791. The incremental region candidate 73 in FIG. 7B has a shape of a partially cut-away ellipse. The following description will proceed by paying attention to the object pads from which have been acquired the probe mark existing region image of FIG. 7A and the incremental region candidate image of FIG. 7B.

In the incremental region acquiring part 422, an all probe mark containing region 81 is defined by a dotted line rectangle circumscribing the plurality of probe mark regions 791 in the probe mark existing region image of FIG. 7A. Further, in the same manner as in the case of acquiring the probe mark existing region image, a region occupied by the existing probe mark regions corresponding to the existing probe marks is acquired from the pre-contact pad image. Then, a rectangle (herein below referred to as an "original rectangle") is found that circumscribes the occupied region, namely, all existing probe mark regions of the pre-contact pad image. The original rectangle is designated by reference numeral 82 and illustrated by a double-dotted line in FIG. 7A. Further, a symmetrical rectangle 83 illustrated with a thin solid line is set within the all probe mark containing region 81, which symmetrical rectangle 83 makes a point symmetry about a center point of the all probe mark containing region 81 with respect to the original rectangle 82 (Step S24). Then, a binary image representing the symmetrical rectangle 83 is created by giving a value "1" to the pixels included in the symmetrical rectangle 83 of the pad region 71 and giving a value "0" to the pixels of the remaining region.

Figure 8:
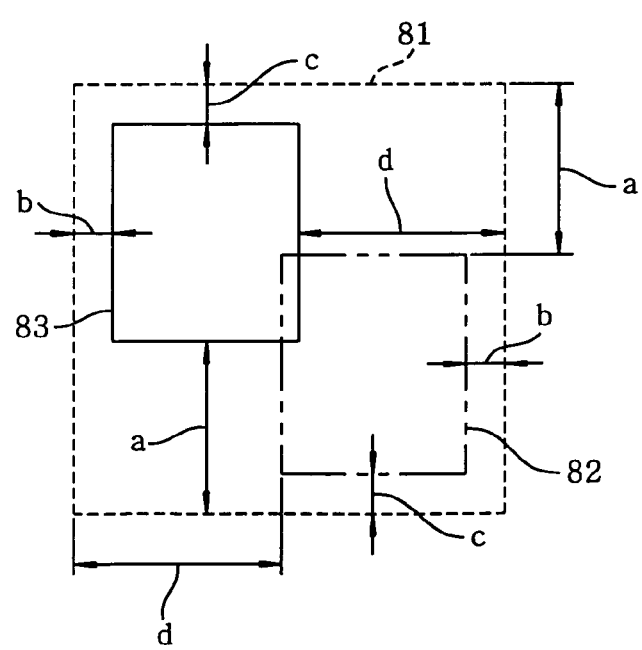
FIG. 8 is a view for explaining a manner of setting a symmetrical rectangle within an all probe mark containing region.

FIG. 8 is a view for explaining a manner of setting the symmetrical rectangle 83 within the all probe mark containing region 81. Assuming that the distances between the boundary (edge) of the original rectangle 82 and the boundary (edge) of the all probe mark containing region 81 are "a" at the upper side of the original rectangle 82, "b" at the right side, "c" at the bottom side and "d" at the left side as illustrated in FIG. 8, the symmetrical rectangle 83 having the same size as that of the original rectangle 82 is set such that the distances between the boundary of the symmetrical rectangle 83 and the boundary of the all probe mark containing region 81 become "c" at the upper side of the symmetrical rectangle 83, "d" at the right side, "a" at the bottom side and "b" at the left side. In this regard, one of the distances "a" and "c" is usually equal to 0 and one of the distances "b" and "d" is also equal to 0. However, in such a case that the existing probe mark region is enclosed by the incremental region candidate, both of the distances "a" and "c" or both of the distances "b" and "d" may be supposed not to be 0. For this reason, in FIG. 8, the original rectangle 82 and the symmetrical rectangle 83 are disposed at positions distant from the boundary of the all probe mark containing region 81.

Once a binary image representing the symmetrical rectangle 83 is created, a logic product is then found of the value of each pixel of the binary image and the value of the corresponding pixel of the probe mark existing region image of FIG. 7A. The logic product thus found is given to the corresponding pixel, thus creating a binary image representing a candidate region for the latest probe mark region (herein below referred to as a "latest probe mark candidate region") In case of the example shown in FIG. 7A, the latest probe mark candidate region is the cross-hatching region designated by reference numeral 74 in the all probe mark containing region 81 shown in FIG. 9. Thus, an image is created wherein the latest probe mark candidate region 74 alone is given a value "1" indicative of a white pixel and the remaining region is given a value "0" indicative of a black pixel. In this way, under the premise that the maximum region regarded as the latest probe mark candidate region has the same shape as that of the entire existing probe mark region, the latest probe mark position acquiring unit 42 treats only the portion of the probe mark existing region 72 included in the symmetrical rectangle 83 as the latest probe mark candidate region 74.

In the incremental region acquiring part 422, a logic product is also found of the value of each pixel of the binary image representing the latest probe mark candidate region 74 and the value of the corresponding pixel of the incremental region candidate image of FIG. 7B. The logic product thus found is given to the corresponding pixel, thus creating a binary image that represents a real incremental region (Step S25). In this connection, the real incremental region is the region designated by reference numeral 75 and enclosed by a thick solid line and a thick broken line in the all probe mark containing region 81 shown in FIG. 9. Thus, an image is created wherein the real incremental region 75 alone is given a value "1" indicative of a white pixel and the remaining region is given a value "0" indicative of a black pixel.

In this way, by adopting only the incremental region candidate 73 included in the symmetrical rectangle 83 as the real incremental region 75 (i.e., the probe mark region increased by the contact of the probes 52), it becomes possible to acquire the real incremental region with an increased degree of precision. That is, even in the case where a similar incremental region candidate is acquired from the binary image representing the incremental region candidate 73 shown in FIG. 7B, e.g., by the adherence of foreign materials to the attention-paid object pads at the end of acquisition of the pre-contact image, the real incremental region can be acquired with an increased degree of precision by excluding the similar incremental region candidate that falls outside the symmetrical rectangle 83. Further, for the sake of simplicity in treatment, the incremental region candidate may be regarded as the real incremental region as it is.

If the real incremental region 75 is acquired, the incremental region complementing part 423 determines whether there exists a region non-continuous with the real incremental region 75 (herein below referred to as a "non-continuous region") in the latest probe mark candidate region 74 (Step S26). In the examples illustrated in FIGS. 7A and 7B, it is determined that the non-continuous region does not exist. Description will be given later as for the case where the non-continuous region exists.

Figure 9:
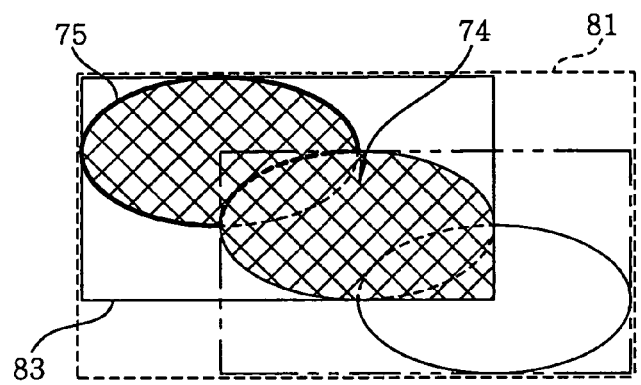
FIG. 9 is a view illustrating a latest probe mark region candidate.
Figure 10:
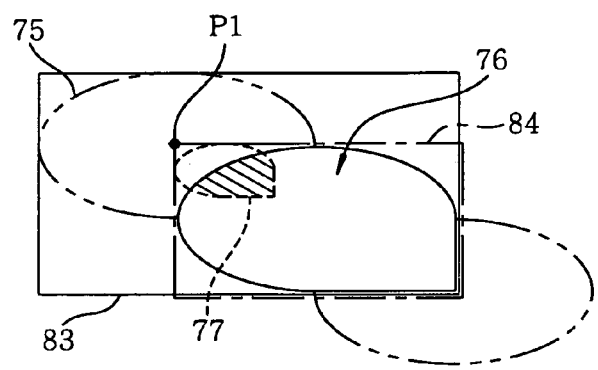
FIG. 10 is a view illustrating a reference complementing region.

Subsequently, the incremental region complementing part 423 acquires a region 76 (herein below referred to as a "reference complementing region") as illustrated by a solid line in FIG. 10, by excluding the real incremental region 75 from the latest probe mark candidate region 74 of FIG. 9, thus creating a binary image that represents the reference complementing region 76. Then, a rectangle circumscribing the reference complementing region 76 is found from the binary image that represents the reference complementing region 76. By fixing a corner point, namely the apex point in FIG. 10, of the rectangle 84 closest to the center of the real incremental region 75 (hereinafter, referred to as a "reference point"), a treatment is conducted to reduce the reference complementing region 76 at a predetermined magnification in row and column directions, thus acquiring a binary image indicative of the post-reduction reference complementing region (the region designated by reference numeral 77 and illustrated by a broken line in FIG. 10).

In this regard, at the time of determining the reduction magnification of the reference complementing region 76, it is necessary to first find a difference Sb (Sb=Sm−Sa) between a value Sm pre-selected as the area of a single probe mark region and an area Sa of the real incremental region 75. The value Sm is prepared in advance by, e.g., forming probe marks through the contact of the probes 52 with the respective pads (having no probe mark) on another substrate and then finding the average value of these probe mark regions. Thereafter, the size of the rectangle 84 circumscribing the reference complementing region 76 is found. If the size of the rectangle 84 thus found is a in a row direction and β in a column direction, the post-reduction size of the rectangle 84 becomes (sqrt(Sb·α/β)) in the row direction and (sqrt(Sb·β/α)) in the column direction, where sqrt(A) denotes the squire root of A. In this manner, the reduction magnification of the reference complementing region 76 is determined in the row direction and the column direction.

In the case that the difference Sb is equal to or smaller than 0, namely if the area Sa of the real incremental region 75 is equal to or greater than the pre-selected value Sm, it is confirmed that no overlap exists between the latest probe mark region and other probe mark region. Accordingly, the setting of the reference complementing region and the next complementing treatment are omitted, and the real incremental region found at the step S25 is set as the latest probe mark region as it is (see the following description made in connection with FIG. 16).

Figure 11:
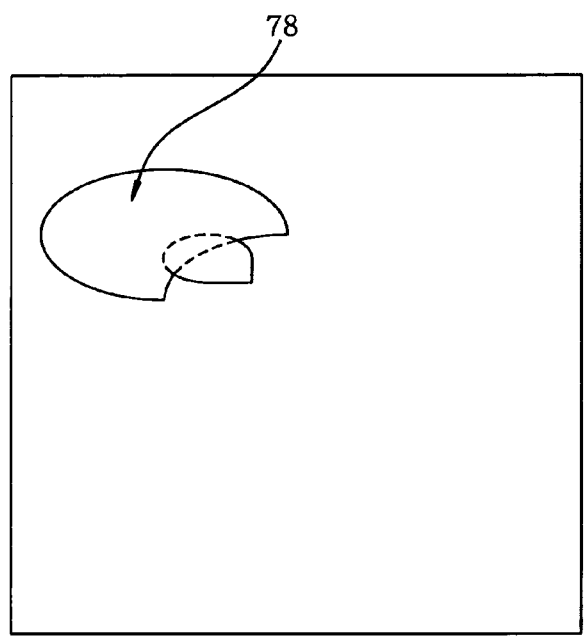
FIG. 11 is a view illustrating a complementing-finished image.

Then, by finding a logic sum of the value of each pixel of the binary image representing the real incremental region 75 and the value of the corresponding pixel of the binary image representing the reference complementing region 77, a fully complemented image is acquired that represents a latest probe mark region as shown in FIG. 11 (Step S27). As noted above, in the event that the area of the real incremental region is less than a predetermined value (usually the area of a single probe mark region), the latest probe mark region 78 is acquired by combining the real incremental region 75 and the portion of the post-reduction reference complementing region 77 not overlapped with the real incremental region 75 (the region of a parallel line hatching in FIG. 10, which will be referred to as a "complementing region" herein below). At this time, the complementing region is disposed within the symmetrical rectangle 83 in a region defined by excluding the real incremental region 75 from the probe mark existing region 72.

The latest probe mark position acquiring unit 42 is adapted to acquire the position of the latest probe mark region by finding the center of the latest probe mark region 78 in the fully complemented image (Step S28). Although the shape of the latest probe mark region 78 in the fully complemented image significantly differs from the shape of a real one, it does not matter because the prober 1 is intended for finding the "position" of the latest probe mark region. In the manner as set forth above, with respect to the plurality of object pads, the position of the latest probe mark region formed by the contact of the probes 52 with the pads is acquired from among the plurality of probe mark regions in the post-contact pad image. In the positional deviation acquiring unit 43, a deviation in a contact position of the probes 52 with the pads is found (Step S14 in FIG. 3A). Further, the position of the latest probe mark region may be set as the position of an out-of-center point representative of the latest probe mark region.

Figure 12:
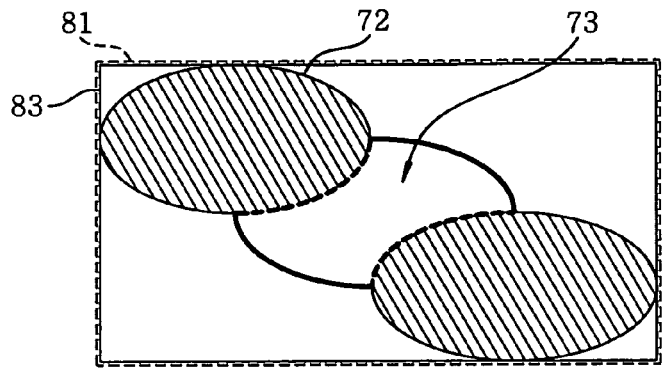
FIG. 12 is a view illustrating an image of a probe mark existing region.

FIG. 12 is a view illustrating an image of the probe mark existing region derived from a post-contact pad image of other object pads. In FIG. 12, the region enclosed by a solid line is set as the probe mark existing region 72, of which the portion enclosed by a thick solid line and a thick broken line is set as the candidate 73 for the incremental region.

If the probe mark existing region 72 and the candidate 73 for the incremental region shown in FIG. 12 are acquired (Steps S22 and S23), the all probe mark containing region 81 is defined by a rectangle circumscribing the probe mark existing region 72 as illustrated by a broken line in FIG. 12, and the symmetrical rectangle 83 (as well as the original rectangle) is set to be the same as the rectangle circumscribing the all probe mark containing region 81 as shown by a solid line in FIG. 12 (Step S24). Subsequently, the probe mark existing region 72 present in the symmetrical rectangle 83 (i.e., the entirety of the probe mark existing region 72) is set as the latest probe mark candidate region, of which the portion overlapping with the candidate 73 of the incremental region (i.e., the entirety of the incremental region candidate 73) is set as the (real) incremental region (Step S25).

Figure 13:
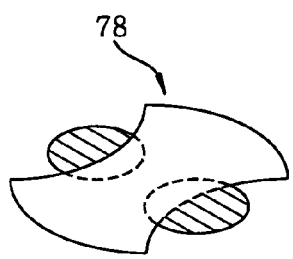
FIG. 13 is a view illustrating a latest probe mark region.

In the example of FIG. 12, it is determined that a non-continuous region does not exist (Step S26). Thus, reference complementing regions (two regions shown by a parallel line hatching in FIG. 12) are acquired by excluding the incremental region from the latest probe mark candidate region. Subsequently, each of the reference complementing regions is reduced in size in the same manner as described above, except that, at the time of determining the reduction magnification, the difference Sb between the pre-contact image-selected value Sm and the area Sa of the incremental region is allotted in proportion to the area of each of the reference complementing regions. By overlapping the post-reduction reference complementing regions on the incremental region, as illustrated in FIG. 13, the latest probe mark region 78 is acquired wherein the incremental region is combined with a part of the post-reduction reference complementing regions, i.e., the complementing region illustrated by a parallel line hatching in FIG. 13 (Step S27). Then, the center of the latest probe mark region 78 is acquired as its position (Step S28), and the deviation in the contact position of the probes 52 with the pads is found (Step S14 in FIG. 3A).

Figure 14:
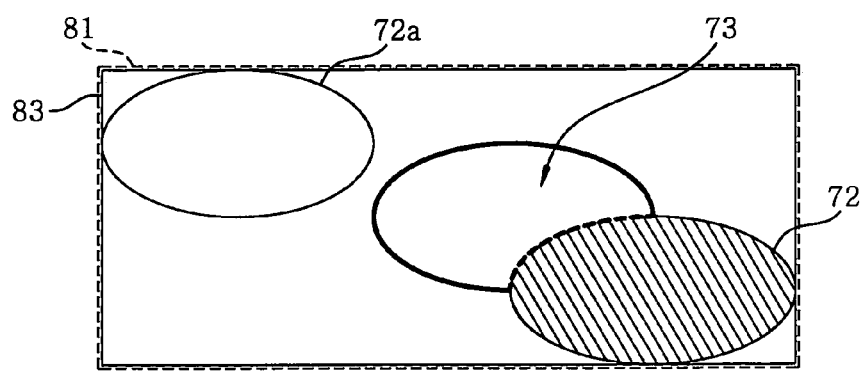
FIG. 14 is a view illustrating an image of a probe mark existing region.

FIG. 14 is a view showing an image of a probe mark existing region derived from a post-contact pad image of further object pads. In FIG. 14, two regions enclosed by a solid line are set as the probe mark existing regions 72, one of which is designated by a reference numeral 72a. Among the probe mark existing regions 72, the portion enclosed by a thick solid line and a thick broken line is set as the candidate 73 of the incremental region.

In this case, the all probe mark containing region 81 is defined by a rectangle circumscribing the two probe mark existing regions 72 as illustrated by a broken line in FIG. 14, and the symmetrical rectangle 83 (as well as the original rectangle) is set to be the same as the rectangle circumscribing the all probe mark containing region 81 as shown by a solid line in FIG. 12 (Step S24). Subsequently, the probe mark existing region 72 included in the symmetrical rectangle 83 (i.e., the entirety of the probe mark existing region 72) is set as the latest probe mark candidate region, of which the portion overlapping with the candidate 73 of the incremental region (i.e., the entirety of the incremental region candidate 73) is set as the incremental region (Step S25).

Figure 15:
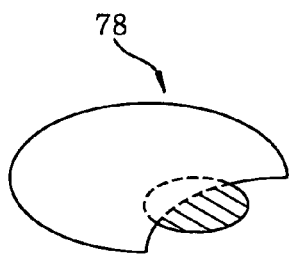
FIG. 15 is a view illustrating a latest probe mark region.

If the incremental region is acquired, the incremental region complementing part 423 determines that the portion of the latest probe mark candidate region corresponding to the probe mark existing regions 72a in FIG. 14 is the non-continuous region that lacks continuity with the incremental region (Step S26). In this regard, it is considered that a single continuous probe mark region is usually formed by the one time contact of the probes 52 with the pads. For this reason, the non-continuous region is excluded from the latest probe mark candidate region (Step S29). Subsequently, the incremental region is also excluded from the latest probe mark candidate region from which the non-continuous region has already been excluded, thus acquiring the reference complementing region (the region illustrated by a parallel line hatching in FIG. 14). By combining the reference complementing region with the reduced region and the incremental region, the latest probe mark region 78 is acquired as shown in FIG. 15 (Step S27) Then, the center of the latest probe mark region 78 is acquired as its position (Step S28).

Figure 16:
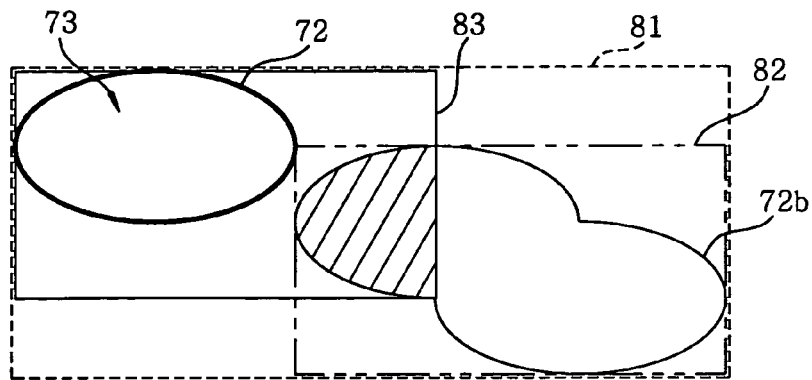
FIG. 16 is a view illustrating an image of a probe mark existing region.

FIG. 16 is a view showing an image of a probe mark existing region derived from a post-contact pad image of still further object pads. In FIG. 16, two regions enclosed by a solid line are set as the probe mark existing regions 72, one of which is designated by a reference numeral 72b. Among the probe mark existing regions 72, the portion enclosed by a thick solid line is set as the candidate 73 of the incremental region.

In case of the probe mark existing regions 72 illustrated in FIG. 16, the all probe mark containing region 81 is defined by a rectangle circumscribing the two probe mark existing regions 72 as illustrated by a broken line in FIG. 16, and the original rectangle 82, which is a rectangle circumscribing the existing probe mark regions of the pre-contact pad image, is set as illustrated by a double-dotted line in FIG. 16. Subsequently, the symmetrical rectangle 83 that makes a point symmetry about the center point of the all probe mark containing region 81 with respect to the original rectangle 82 is set as illustrated by a solid line in FIG. 16 (Step S24). The probe mark existing region 72 included in the symmetrical rectangle 83 is determined to be the latest probe mark candidate region, of which the portion overlapping with the candidate 73 of the incremental region (i.e., the entirety of the incremental region candidate 73) is set as the (real) incremental region (Step S25).

If the incremental region is acquired, it is determined that the portion of the latest probe mark candidate region belonging to the probe mark existing region 72b of FIG. 16 (the region of a parallel line hatching in FIG. 16) is the non-continuous region that lacks continuity with the incremental region (Step S26). The non-continuous region is excluded from the latest probe mark candidate region (Step S29). Thus, the latest probe mark candidate region coincides with the incremental region. There exists no reference complementing region obtained by excluding the incremental region from the latest probe mark candidate region. Further, the area of the incremental region becomes equal to or greater than the value pre-selected as the area of a single probe mark region. For this reason, the incremental region is acquired as the latest probe mark region as it is (Step S27), and the position of the latest probe mark region is acquired (Step S28). Moreover, in the object pads from which the image of the probe mark existing region shown in FIG. 5B and the image of the incremental region candidate illustrated in FIG. 6B are acquired, the area of the incremental region becomes equal to or greater than the value pre-selected as the area of a single probe mark region and no reference complementing region exists as in the case noted above. The incremental region is acquired as the latest probe mark region as it is.

Figure 17:
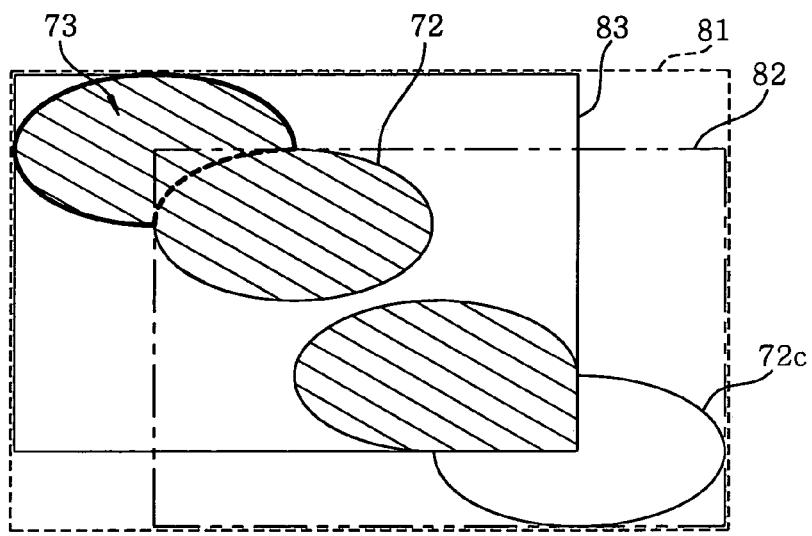
FIG. 17 is a view illustrating an image of a probe mark existing region.

FIG. 17 is a view showing an image of a probe mark existing region derived from a post-contact pad image of yet still further object pads. In FIG. 17, two regions enclosed by a solid line are set as the probe mark existing regions 72, one of which is designated by a reference numeral 72c. Among the probe mark existing regions 72, the portion enclosed by a thick solid line and a thick broken line is set as the candidate 73 of the incremental region.

In this case, the symmetrical rectangle 83 is set as shown by a solid line in FIG. 17 (Step S24), and the probe mark existing region 72 included in the symmetrical rectangle 83 (the region of a parallel line hatching in FIG. 17) is set as the latest probe mark candidate region, of which the portion overlapping with the candidate 73 of the incremental region (i.e., the entirety of the incremental region candidate 73) is set as the real incremental region (Step S25). Subsequently, it is determined that the portion of the latest probe mark candidate region belonging to the probe mark existing region 72c of FIG. 17 is the non-continuous region that lacks continuity with the incremental region (Step S26). The non-continuous region is excluded from the latest probe mark candidate region (Step S29). Then, the incremental region is also excluded from the latest probe mark candidate region from which the non-continuous region has already been excluded, thus acquiring the reference complementing region. The same latest probe mark region as shown in FIG. 15 is acquired (Step S27), after which the position of the latest probe mark region is acquired (Step S28).

As described in the foregoing, in the prober 1, the post-contact image representing a region inclusive of the pads is acquired by capturing the image of the substrate 9 after the probes 52 has been brought into contact with the pads. Then, the post-contact pad image derived from the post-contact image and representing the pad region is compared with the pre-contact pad image representing the pad region prior to the contact of the probes 52 with the pads, thereby acquiring the position of the latest probe mark region formed by the contact of the probes 52 with the pads. Thus, the position of the latest probe mark is acquired from among the plurality of probe marks while conducting the probe mark inspection with the use of the post-contact image, and the deviation in the contact position of the probes 52 with the pads can be efficiently acquired.

Further, in the event that the latest probe mark region overlaps with other probe mark regions, the position of the latest probe mark can be easily acquired by disposing the complementing region in other regions continuous with the incremental region of the probe mark existing region and connecting the complementing region to the incremental region. In addition, inasmuch as the size of the complementing region is determined by the difference between the value pre-selected as the area of a single probe mark region and the area of the incremental region, it is possible to prevent the size of the complementing region from becoming unnecessarily greater or smaller, thus allowing the position of the latest probe mark to be acquired with an increased degree of precision.

Now, description will be provided as for another embodiment of the probing process performed in the prober 1. In this embodiment of the probing process, existing probe marks are formed by the previous probing in the prober 1 (or another prober), and a multiple tone pre-contact image is already acquired. The processing unit 4 extracts the portion of pad region from the pre-contact image to acquire a pre-contact pad image, and the image storage unit 44 stores the data of the binary pre-contact pad image acquired by binarizing the pre-contact pad image with a predetermined threshold value. Further, the binary pre-contact pad image may be subject to a compressing treatment (e.g., a run-length compression) if needed, and the multiple tone pre-contact image may be discarded.

Figure 18A:
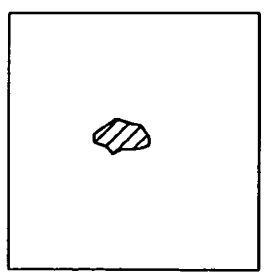
FIG. 18A is a view illustrating a binary image of a pre-contact pad.

FIG. 18A is a view illustrating a binary image of the pre-contact pads. At the time when the pre-contact pad image is binarized, the pixel having its value equal to or greater than the threshold value is given a value "1" representing a white pixel and the pixel having its value smaller than the threshold value is given a value "0" representing a black pixel. In FIG. 18A (and FIG. 18C described later), the black pixel is illustrated by a parallel line hatching.

In this embodiment of probing process, the substrate 9 is mounted on the stage 2 after the existing probe marks are formed (after the previous probing has been performed), and a post-contact image is acquired after an electrical inspection has been conducted through the contact of the probes 52 with the pads (Steps S11 and S12 in FIG. 3). Through the process described above, the portion of the pad region is extracted from the post-contact image to acquire a post-contact pad image (Step S21 in FIG. 3B).

Figure 18B:
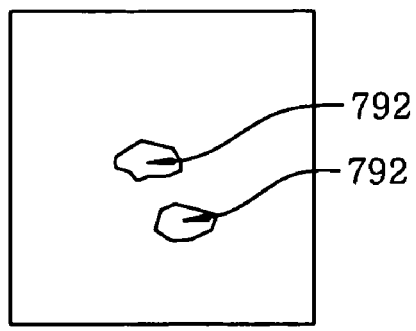
FIG. 18B is a view illustrating a multiple tone image of a post-contact pad.

FIG. 18B is a view illustrating the multiple tone post-contact pad image. The post-contact pad image is a 256-tone image whose pixels are represented by values of 0-255, for instance. Each of two regions designated by reference numeral 792 in FIG. 18B actually contains the pixels having lower values than those of other regions.

Subsequently, a probe mark existing region is acquired from the post-contact pad image (Step S22). The incremental region acquiring part 422 acquires an incremental region candidate by comparing the multiple tone post-contact pad image with the binary pre-contact pad image corresponding thereto (Step S23). In case of acquiring the incremental region candidate, if each of the pixels of the binary pre-contact pad image has the value 0 indicative of a black pixel, a value "255" is given to the pixels irrespective of the value of the corresponding pixels in the post-contact pad image. If, however, each pixel has the value 1 indicative of a white pixel, the pixel is given the value of the corresponding pixels in the post-contact pad image. This creates a multiple tone combined image. The value of each pixel of the combined image is compared with a predetermined threshold value (which may be the same as the threshold value employed in the probe mark existing region acquiring part 421). The pixel having its value equal to or greater than the threshold value is given a value "1" indicative of a white pixel, and the pixel having its value smaller than the threshold value is given a value "0" indicative of a black pixel, thus creating a binary combined image. Then, after the values 1 and 0 of the binary combined image are exchanged, a set of 1-value pixels interconnected to one another by a labeling treatment is specified to acquire clusters. Fine-sized clusters or unnecessary noises created in the vicinity of an edge of the regions 792 are eliminated by conducting a contracting treatment and then an expanding treatment with respect to each of the clusters.

Figure 18C:
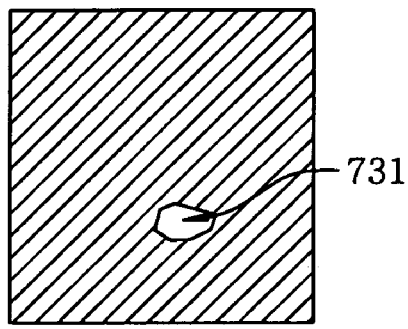
FIG. 18C is a view illustrating an image of an incremental region candidate.

In this way, the incremental region acquiring part 422 acquires only the cluster 731, an incremental region candidate, as illustrated in FIG. 18C, by performing a binarization after the post-contact pad image has been substantially masked by the pre-contact pad image. If the incremental region candidate is acquired, a real incremental region is then acquired in the same manner as described above. If needed, a complementing region is combined with the incremental region, thus acquiring a latest probe mark region (Steps S24-S27). And, after the position of the latest probe mark region has been acquired (Step S28), a deviation in a contact position of the probes 52 with the pads on the substrate 9 is acquired (Step S14 in FIG. 3A).

As described above, in this probing embodiment of the prober 1, the pre-contact pad image stored at the image storage unit 44 becomes a binary image. In this connection, assuming that about 75,000 pads are formed on a semiconductor substrate of 300 mm in diameter and further that a plurality of multiple tone pre-contact pad images (or pre-contact pad images) acquired by conducting a probe mark inspection with respect to the whole pads of such a substrate are stored at the image storage unit 44 as it is, the image storage unit 44 requires a memory capacity of several gigabits and a difficulty is encountered in the management of data. Particularly, in the case where the pre-contact images are acquired by other devices than the prober 1, it is required to transfer the data of the pre-contact images from the devices to the prober 1. However, it is usually not easy and time-consuming to transmit the data of several gigabits, often causing a difficulty in operating the prober 1.

In contrast, in this probing embodiment, by preparing the pre-contact pad images as binary images whose size is quite smaller than that of multiple tone images, it becomes possible not only to reduce the memory capacity of the image storage unit 44 but also to carry out the data transmission of the pre-contact images with ease and in a shortened period of time even when the pre-contact images are acquired by means of other devices than the prober 1. Further, the process of masking the pre-contact pad images with the post-contact pad images may be conducted by a different method than those described above. Moreover, the image storage unit 44 may store images obtained by binarizing the entire pre-contact images prior to extracting the portion of pad regions therefrom.

Figure 19:
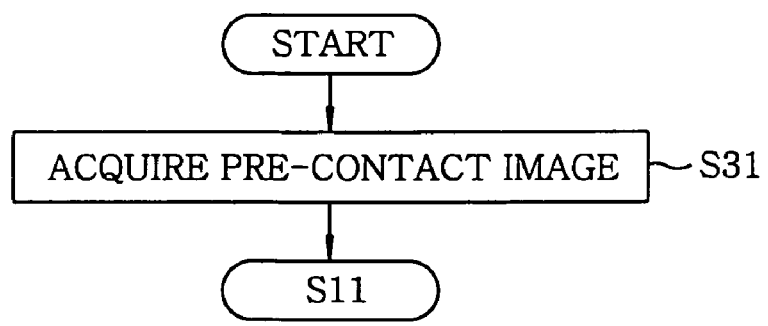
FIG. 19 is a view illustrating a part of the flow of a probing process in a prober.

Now, description will be offered regarding a further another embodiment of the probing process performed in the prober 1. FIG. 19 is a view illustrating a part of the flow of the probing process carried out in the prober 1 and showing the process performed prior to the step S11 in FIG. 3A. In this embodiment, no pre-contact image is prepared in the image storage unit 44.

In the prober 1, the substrate 9 as a test object is mounted on the stage 2 and then a pre-contact image representing a region inclusive of object pads is acquired by means of the image pickup unit 3 (Step S31). Thereafter, the substrate 9 is moved to a position under the probes 52 while being mounted on the stage 2 so that an electrical inspection can be conducted (Step S11 in FIG. 3A) thereon. Namely, immediately before the probes 52 are brought into contact with the pads on the substrate 9, the image pickup unit 3 acquires a pre-contact image. Subsequently, a post-contact image is acquired by means of the image pickup unit 3 (Step S12). In the same manner as in the preceding process embodiment, the position of a latest probe mark region is acquired and then the deviation in a contact position of the probes 52 with the pads is acquired (Steps S13 and S14).

Typically, at semiconductor manufacture factories or the like, a plurality of probers are installed to inspect a large number of substrates. In this case, even though multiple tone pre-contact images have been acquired by e.g., conducting the probe mark inspection with different devices on substrates in a lot basis, it is necessary to perform cumbersome tasks or to provide a network for management in order to transmit the multiple tone pre-contact images to the prober 1 in coincidence with the operation of transferring the substrate 9 of the corresponding lot to the prober 1. Further, there may be a case where the image-taking probe mark inspection is not performed during the probing process for forming the existing probe marks. In contrast, in the probing embodiment of FIG. 19, by allowing the image pickup unit 3 to acquire the pre-contact image immediately before the probes 52 are brought into contact with the pads, the deviation in the contact position of the probes 52 with the pads can be easily acquired without resort to any cumbersome tasks of data transmission, thus making it possible to cope with various system environments around the installation places of the prober 1.

Further, it will suffice that the data of the pre-contact images are temporarily stored until a latest probe mark region is acquired. After acquisition of the latest probe mark region, the pre-contact images may be deleted. Also, there is no need to have the probes 52 make contact with the pads within a short period of time after acquisition of the pre-contact images. If the substrate 9 is not removed from the stage 2 during the time period between the acquisition of the pre-contact images and the contact of the probes 52 with the pads, it can be said that the pre-contact images were acquired immediately before the probes 52 are brought into contact with the pads.

Although preferred embodiments of the present invention have been described in the foregoing, the invention shall not be limited to the preceding embodiments but may be subject to various changes or modifications.

In the embodiments described above, the existing probe marks are one to three in number. Alternatively, four or more existing probe marks may be formed on the pads, whichever case the prober 1 can acquire the position of the latest probe mark formed by the contact of the probes 52 with the pads having at least one existing probe mark.

In the afore-mentioned embodiments, the position of the latest probe mark region is acquired by comparing the pre-contact pad image with the post-contact pad image. However, the processing unit 4 may acquire the incremental region increased by the contact of the probes 52 with the pads form the probe mark existing region and the position of the latest probe mark region, by comparing the pre-contact pad image with the post-contact pad image as it is without having to extract the portion corresponding to the pad region.

In the incremental region complementing part 423, the complementing region may be created by other methods than the above method wherein a reference complementing region is acquired and reduced in size, as long as the complementing region is combined with the incremental region in the probe mark existing region excluding the incremental region.

Further, the deviation in the contact position of the probes 52 with the pads does not have to be found based on the position of a plurality of latest probe mark regions acquired for a plurality of object pads, but may be found in a simpler manner based on the position of a latest probe mark region acquired for a single object pad.

In the case where there exists no need for the processing unit 4 to rapidly acquire the deviation in the contact position of the probes 52 with the pads, the same functions as the entirety or a part of the processing unit 4 (excluding the image storage unit 44) shown in FIG. 2 may be embodied by a software in the computer 6. Moreover, the functions of the image storage unit 44 may be played by a memory device such as a hard disk of the computer 6 or the like.

The functions of the prober 1 for acquiring the deviation in the contact position of the probes with the pads through the acquisition of the position of the latest probe mark from among the plurality of probe marks on the pads may be provided to other test devices that conduct an electrical inspection by brining probes into contact with electrodes included in test objects such as wiring patterns formed on a substrate. The substrate 9 does not have to be a semiconductor substrate but may be a printed circuit board or a glass substrate on which are formed test objects inclusive of electrodes.

While the invention has been shown and described with respect to the preferred embodiments, it will be understood by those skilled in the art that various changes and modifications may be made without departing from the spirit and scope of the invention as defined in the following claims.

What is claimed is:

1. A probing apparatus for conducting an electrical inspection for a test object formed on a substrate, comprising:
    a probe for making contact with an electrode formed on the substrate;
    an image pickup unit for acquiring a first image representing a region inclusive of the electrode, by capturing an image of the substrate after the probe has been brought into contact with the electrode having thereon at least one previously formed probe mark;
    an image storage unit for storing a second image representing a region inclusive of the electrode before the probe is brought into contact with the electrode;
    a latest probe mark position acquiring unit for, by comparing the first image with the second image, acquiring a position of a latest probe mark region created by the contact of the probe with the electrode from among a plurality of probe mark regions in the first image respectively corresponding to a plurality of probe marks, the probe marks including said at least one previously formed probe mark and a latest probe mark made by the contact of the probe;

a positional deviation acquiring unit for finding a deviation in a contact position of the probe with respect to the electrode, based on the position of the latest probe mark region;

an incremental region acquiring part for, by comparing the first image with the second image, acquiring an incremental region increased by the contact of the probe with the electrode from a probe mark existing region occupied by the plurality of probe mark regions; and an incremental region complementing part for, if the incremental region has an area smaller than a predetermined value, acquiring the latest probe mark region by combining the incremental region with a complementing region in the probe mark existing region from which the incremental region is excluded.

2. The probing apparatus of claim 1, wherein the deviation of the contact position found in the positional deviation acquiring unit is used as a correction amount when the probe or a probe of other probing apparatus is next brought into contact with the electrode of the substrate.

3. The probing apparatus of claim 1, wherein the incremental region complementing part is adapted to, within an all probe mark containing region defined by a rectangle circumscribing the plurality of probe mark regions in the first image, set a symmetrical rectangle that makes a point symmetry about a center point of the all probe mark containing region with respect to a rectangle circumscribing at least one probe mark region in the second image corresponding to said at least one probe mark, and the complementing region is disposed within the symmetrical rectangle.

4. The probing apparatus of claim 1, wherein the size of the complementing region is determined based on the difference between a predetermined value indicative of a single probe mark area and an area of the incremental region.

5. The probing apparatus of claim 1, wherein the second image is a binary image and the incremental region is acquired by conducting a binarization after the first image is masked by the second image in the incremental region acquiring part.

6. The probing apparatus of claim 1, wherein the second image is an image acquired by the image pickup unit immediately before the probe makes contact with the electrode.

7. A positional deviation acquiring method for finding a contact position deviation of a probe which makes contact with an electrode formed on a substrate, in a probing apparatus for conducting an electrical inspection for a test object formed on the substrate, comprising the steps of:

acquiring a first image representing a region inclusive of the electrode by capturing an image of the substrate after the probe has been brought into contact with the electrode having thereon at least one previously formed probe mark;

acquiring a position of a latest probe mark region created by the contact of the probe with the electrode from a plurality of probe mark regions in the first image respectively corresponding to a plurality of probe marks left on the electrode, by comparing the first image with a second image representing a region inclusive of the electrode before the probe is brought into contact with the electrode;

finding a deviation in a contact position of the probe with respect to the electrode, based on the position of the latest probe mark region;

acquiring an incremental region increased by the contact of the probe with the electrode from a probe mark existing region occupied by the plurality of probe mark regions by comparing the first image with the second image; and acquiring the latest probe mark region by combining the incremental region with a complementing region in the probe mark existing region from which the incremental region is excluded if the incremental region has an area smaller than a predetermined value.

* * * * *